United States Patent
Fisher et al.

(10) Patent No.: US 10,236,067 B2
(45) Date of Patent: Mar. 19, 2019

(54) STATE-DEPENDENT READ VOLTAGE THRESHOLD ADAPTATION FOR NONVOLATILE MEMORY

(71) Applicant: INTERNATIONAL BUSINESS MACHINES CORPORATION, Armonk, NY (US)

(72) Inventors: Timothy J. Fisher, Cypress, TX (US); Thomas Mittelholzer, Zurich (CH); Nikolaos Papandreou, Zurich (CH); Thomas Parnell, Zurich (CH); Charalampos Pozidis, Thalwil (CH)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 15/667,473

(22) Filed: Aug. 2, 2017

(65) Prior Publication Data
US 2019/0043588 A1    Feb. 7, 2019

(51) Int. Cl.
| G11C 11/34 | (2006.01) |
| G11C 16/26 | (2006.01) |
| G11C 16/04 | (2006.01) |
| G11C 16/22 | (2006.01) |

(52) U.S. Cl.
CPC .............. *G11C 16/26* (2013.01); *G11C 16/04* (2013.01); *G11C 16/22* (2013.01)

(58) Field of Classification Search
CPC .......... G11C 16/26; G11C 16/04; G11C 16/22
USPC ..................................................... 365/185.24
See application file for complete search history.

(56) References Cited

U.S. PATENT DOCUMENTS

| 7,084,436 | B2* | 8/2006 | DenBaars | ............... | H01L 33/08 |
| | | | | | 257/101 |
| 8,218,363 | B2 | 7/2012 | Kim et al. | | |
| 8,259,506 | B1* | 9/2012 | Sommer | ............. | G11C 11/5642 |
| | | | | | 365/185.03 |
| 8,339,847 | B2 | 12/2012 | Lim et al. | | |
| 8,495,283 | B2 | 7/2013 | Park et al. | | |
| 9,454,420 | B1* | 9/2016 | Tai | ......... | G06F 11/073 |
| 9,563,502 | B1* | 2/2017 | Alhussien | | |
| 9,659,664 | B1* | 5/2017 | Griffin | ................... | G11C 16/26 |
| 9,680,504 | B2* | 6/2017 | Kim | ................... | H03M 13/1108 |
| 9,697,906 | B2* | 7/2017 | Sanasi | ..................... | G11C 16/26 |
| 9,728,263 | B2* | 8/2017 | Sharon | ................... | G11C 16/26 |
| 9,818,488 | B2* | 11/2017 | Sankaranarayanan | ...................... | |
| | | | | | G11C 16/26 |

(Continued)

OTHER PUBLICATIONS

Cai, Y., Haratsch, E. F. & Mutlu. O. et al. (2012). Error patterns in MLC NAND flash memory: Measurement, characterization, and analysis. Design, Automation & Test in Europe Conference & Exhibition (DATE). doi: 10.1109/DATE.2012.6176524.

(Continued)

*Primary Examiner* — Viet Q Nguyen
(74) *Attorney, Agent, or Firm* — Brian F. Russell; Robert Sullivan

(57) ABSTRACT

A controller adapts the read voltage thresholds of a memory unit in a non-volatile memory. In one embodiment, the controller determines, based on statistics for a memory unit of the non-volatile memory, an operating state of the memory unit from among a plurality of possible operating states and adapts at least one read voltage threshold for a memory cell in the memory unit based on the determined operating state.

19 Claims, 9 Drawing Sheets

(56) References Cited

U.S. PATENT DOCUMENTS

| | | | | |
|---|---|---|---|---|
| 2009/0282186 | A1* | 11/2009 | Mokhlesi | G11C 11/5642 711/103 |
| 2010/0296350 | A1* | 11/2010 | Kim | G11C 11/5642 365/189.15 |
| 2011/0216590 | A1* | 9/2011 | Eun | G11C 16/10 365/185.03 |
| 2012/0008414 | A1* | 1/2012 | Katz | G11C 16/26 365/185.24 |
| 2012/0221772 | A1* | 8/2012 | Seol | G06F 13/1668 711/103 |
| 2013/0094289 | A1* | 4/2013 | Sridharan | G11C 11/5628 365/185.03 |
| 2014/0101519 | A1* | 4/2014 | Lee | G06F 11/1068 714/773 |
| 2014/0237165 | A1* | 8/2014 | Seo | G06F 12/0246 711/103 |
| 2014/0258796 | A1* | 9/2014 | Ghaly | G01R 31/3171 714/708 |
| 2014/0355340 | A1* | 12/2014 | Sharon | G11C 16/26 365/185.03 |
| 2014/0359202 | A1* | 12/2014 | Sun | G11C 16/34 711/103 |
| 2015/0162057 | A1* | 6/2015 | Alhussien | G11C 13/004 365/189.11 |
| 2015/0199149 | A1* | 7/2015 | Sankaranarayanan | G06F 3/0653 711/102 |
| 2015/0378815 | A1* | 12/2015 | Goda | G06F 11/1068 714/764 |
| 2016/0098216 | A1* | 4/2016 | Huang | G06F 11/1072 714/37 |
| 2016/0118129 | A1* | 4/2016 | Muchherla | G11C 16/26 365/185.12 |
| 2016/0141048 | A1 | 5/2016 | Camp et al. | |
| 2017/0125111 | A1* | 5/2017 | Sankaranarayanan | G06F 11/0727 |
| 2017/0169890 | A1* | 6/2017 | Griffin | G11C 16/26 |
| 2017/0249227 | A1* | 8/2017 | Kim | G06F 12/16 |
| 2017/0255403 | A1* | 9/2017 | Sharon | G06F 3/0619 |
| 2018/0011753 | A1* | 1/2018 | Alhussien | G06F 11/076 |

OTHER PUBLICATIONS

Mielke, L., Marquart. T. & Wu, N. et al. (2008). Bit error rate in NAND Flash memories. 2008 IEEE International Reliability Physics Symposium. doi: 10.1109/RELPHY.2008.4558857.

IBM. (2006). Robust nonvolatile Memory Storage. IBM TDB. IP.COM000144108D.

Lee, J. D., Choi, J. H. & Park, D. et al. (2003). Data retention characteristics of sub-100 nm NAND flash memory cells. IEEE Electron Device Letters, 24(12). doi: 10.1109/LED.2003.820645.

* cited by examiner

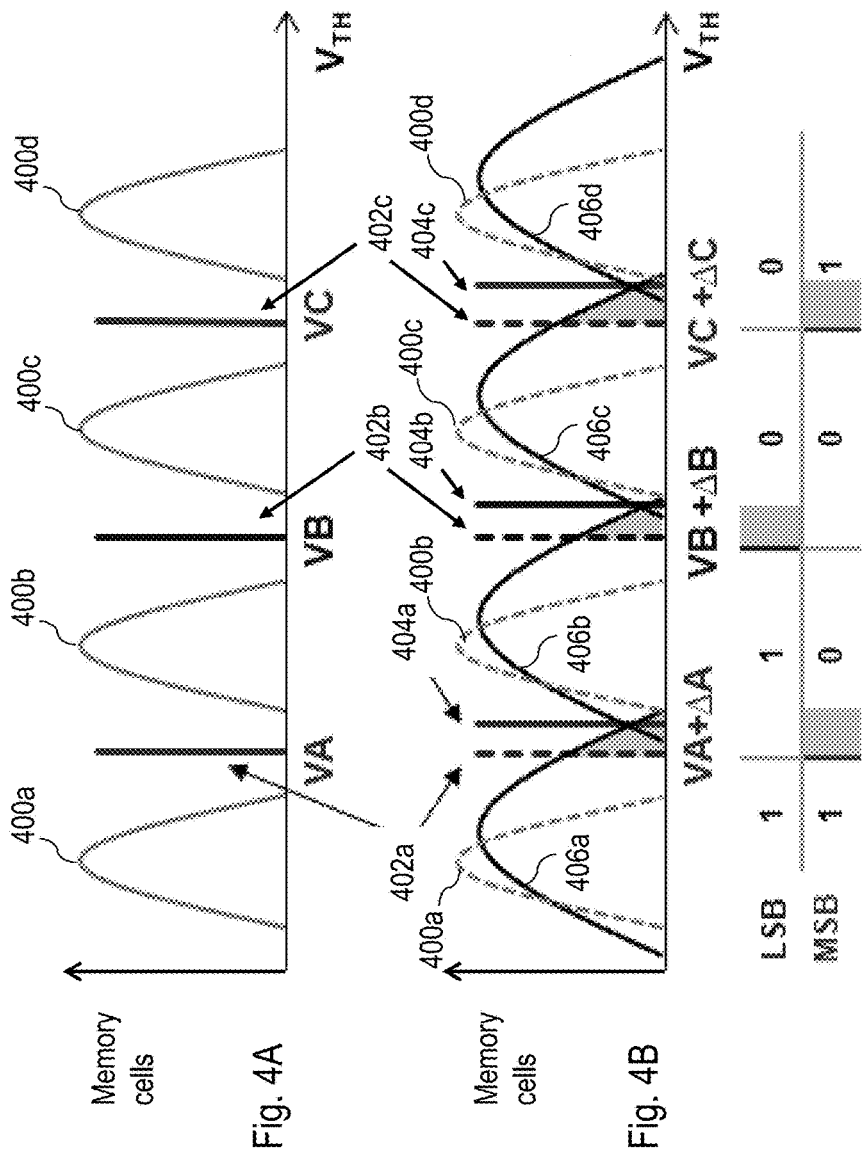

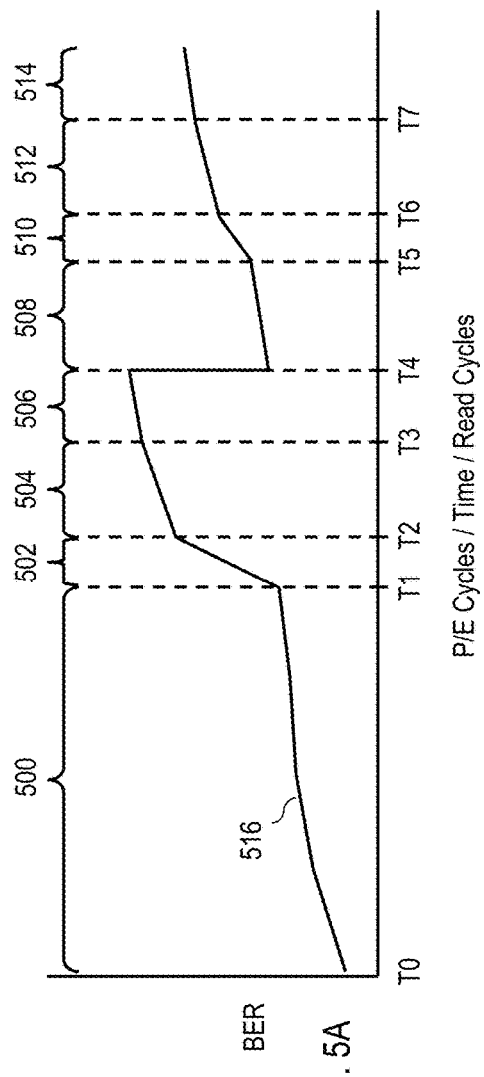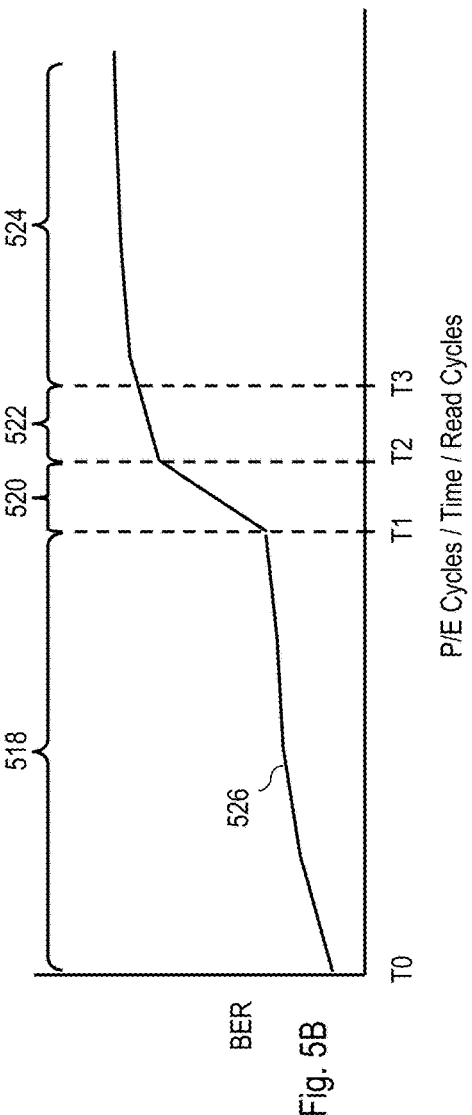

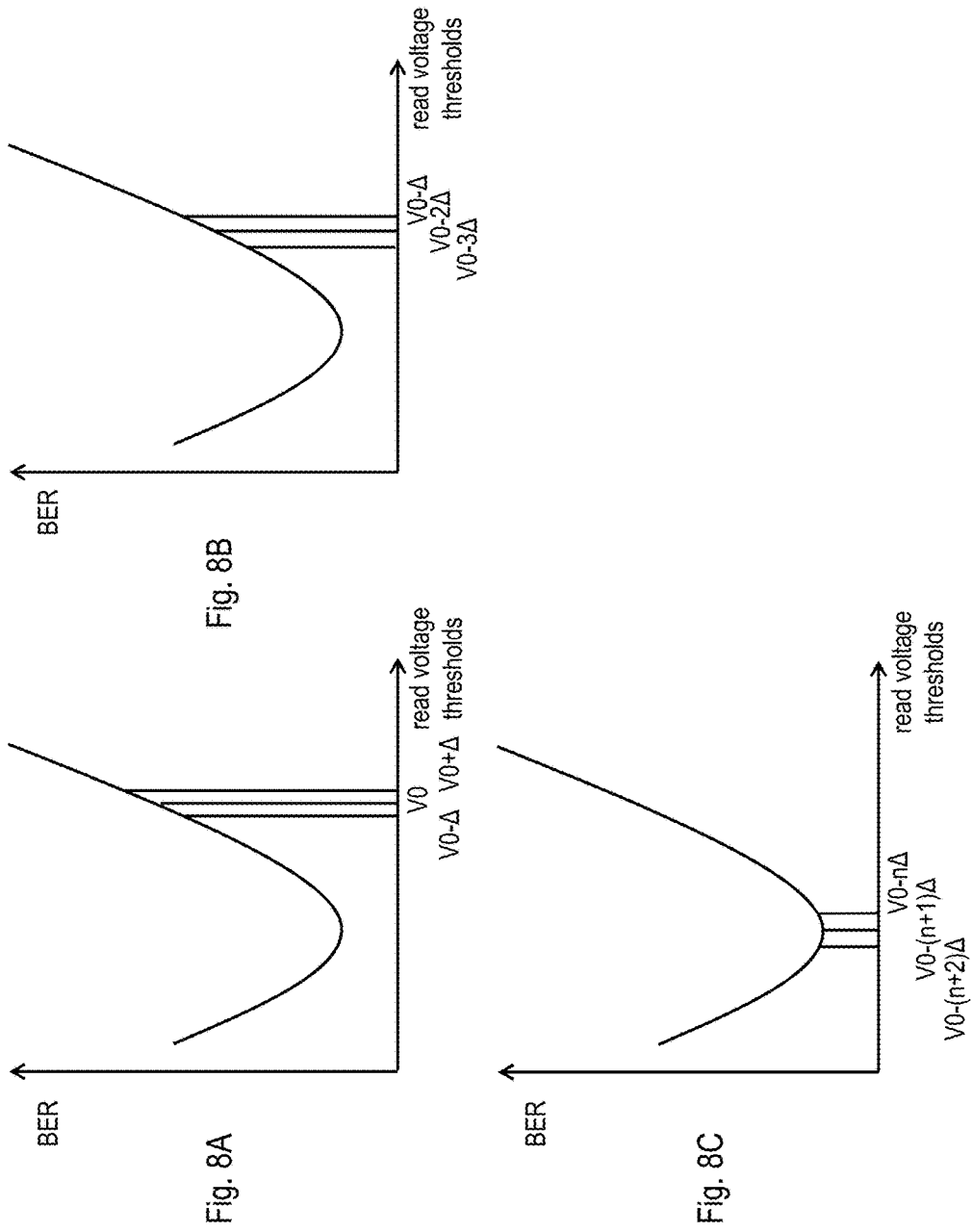

STATE-DEPENDENT READ VOLTAGE THRESHOLD ADAPTATION FOR NONVOLATILE MEMORY

BACKGROUND OF THE INVENTION

This disclosure relates to data processing and data storage, and more specifically, to adaptation of one or more read voltage thresholds for a unit of data storage in a non-volatile memory system. Still more particularly, the disclosure relates a state-dependent read voltage threshold adaptation for a non-volatile memory system.

NAND flash memory is an electrically programmable and erasable non-volatile memory technology that stores one or more bits of data per memory cell as a charge on the floating gate of a transistor or a similar charge trap structure. The amount of charge on the floating gate modulates the threshold voltage of the transistor. By applying a proper read voltage and measuring the amount of current, the programmed threshold voltage of the memory cell can be determined and thus the stored information can be detected. Memories storing one, two, three and four bits per cell are respectively referred to in the art as Single Level Cell (SLC), Multi-Level Cell (MLC), Three Level Cell (TLC), and Quad Level Cell (QLC) memories. In a typical implementation, a NAND flash memory array is organized in blocks (also referred to as "erase blocks") of physical memory, each of which includes multiple physical pages each in turn containing a multiplicity of memory cells. By virtue of the arrangement of the word and bit lines utilized to access memory cells, flash memory arrays have generally been programmed on a page basis, but erased on a block basis.

In multi-level (i.e., MLC, TLC and QLC) NAND flash memory, information is stored by programming the memory cells to various quantized threshold voltage levels according to the device's programming algorithm, which maps the binary bit values to discrete threshold voltage levels. In response to a page read command, the binary bit values are retrieved by applying appropriate read voltages that divide the programmed threshold voltage window into discrete regimes and by then applying a reverse mapping between the detected threshold voltage levels and the corresponding binary bit values. Over the lifetime of a multi-level NAND flash memory device, the distributions of programmed threshold voltage generally become degraded due to the effects of wear on the memory cells. Consequently, it is generally desirable to adapt the read voltage thresholds defining the various bit values over time to compensate for the effects of wear and to extend the useful life of the NAND memory device.

BRIEF SUMMARY

The present disclosure appreciates that conventional techniques of adapting the read voltage thresholds of a memory device do not do not account for differences in the amount and rate of the distortion of the distributions of programmed threshold voltages based on the different possible operating states of the unit of memory under test (e.g., program/erase (P/E) cycling, data retention, or read disturb). The present disclosure also appreciates that, in practice, changes in the programmed threshold voltage distributions can be abrupt and that conventional techniques of adapting the read voltage thresholds may track changes to distributions too slowly to compensate for such abrupt changes in the distributions. As a result of these drawbacks, conventional techniques of adapting read voltage thresholds may select improper read voltage thresholds to define the bit values stored in the memory cells, and the number of bit errors experienced for read commands may consequently increase rapidly.

In at least one embodiment, a controller adapts the read voltage thresholds of a memory unit in a non-volatile memory by determining, based on statistics for a memory unit of the non-volatile memory, an operating state of the memory unit from among a plurality of possible operating states. The controller then adapts at least one read voltage threshold for a memory cell in the memory unit based on the determined operating state.

BRIEF DESCRIPTION OF THE SEVERAL VIEWS OF THE DRAWINGS

FIGS. 4A-4B depict initial and subsequent programmed threshold voltage distributions for an exemplary multi-level cell (MLC) NAND flash memory;

FIGS. 5A-5B illustrates bit error rate curves for a NAND flash memory that reflect the degradation of threshold voltage distributions due to P/E cycling, read disturb effects and data retention;

FIG. 8A-8C are graphs illustrating the selection of read voltage thresholds providing minimum bit error rates according to the process of FIG. 7.

DETAILED DESCRIPTION

Figure 1A:
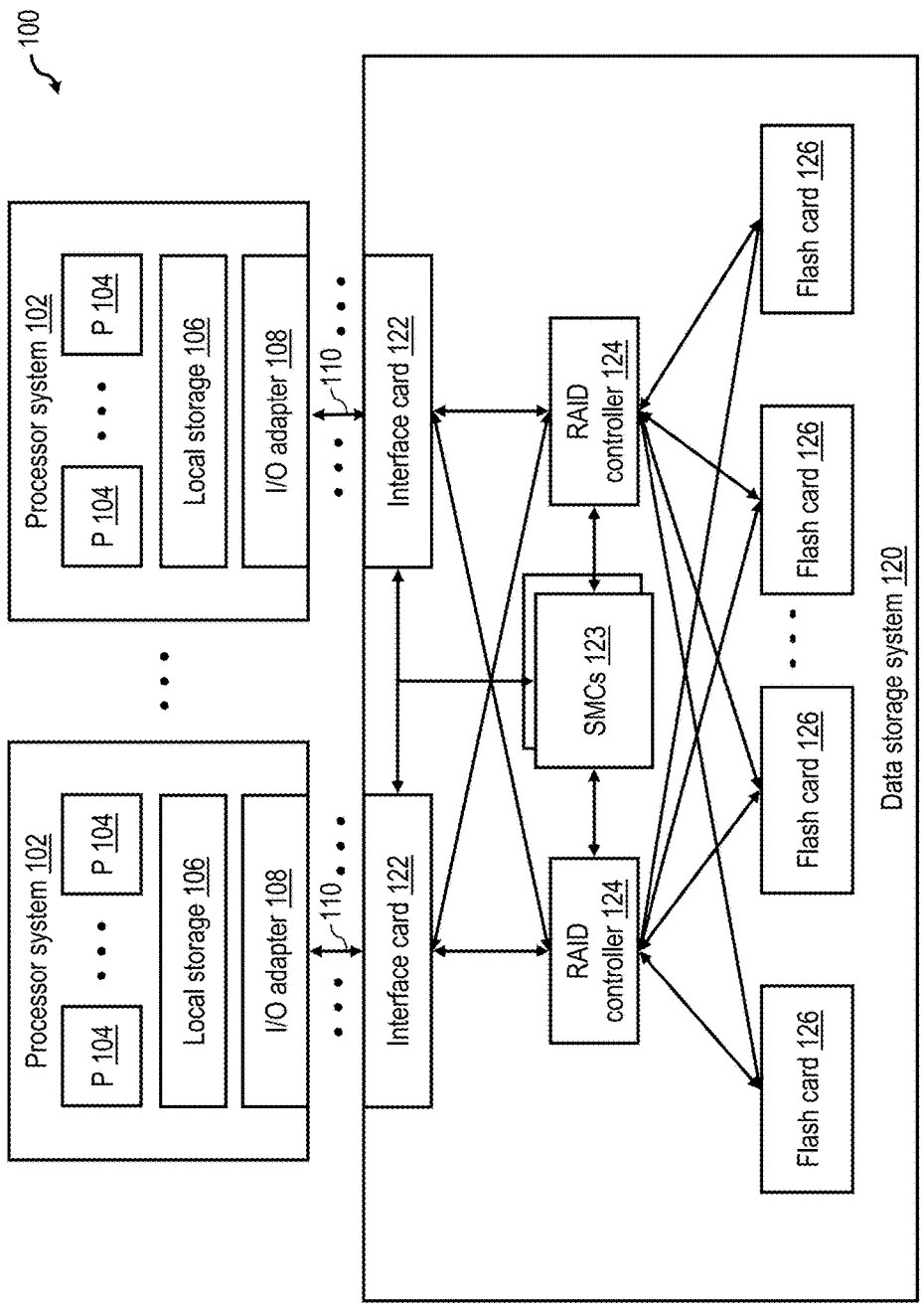
FIG. 1A is a high level block diagram of a data processing environment in accordance with one embodiment.

With reference to the figures and with particular reference to FIG. 1A, there is illustrated a high level block diagram of an exemplary data processing environment 100 including a data storage system 120 having a non-volatile memory array as described further herein. As shown, data processing environment 100 includes one or more hosts, such as a processor system 102 having one or more processors 104 that process instructions and data. A processor system 102 may additionally include local storage 106 (e.g., dynamic random access memory (DRAM) or disks) that may store program code, operands and/or execution results of the processing performed by processor(s) 104. In various embodiments, a processor system 102 can be, for example, a mobile computing device (such as a smartphone or tablet), a laptop or desktop personal computer system, a server computer system (such as one of the POWER series of servers available from International Business Machines Corporation), or a mainframe computer system. A processor system 102 can also be an embedded processor system using various processors such as ARM, PowerPC, Intel X86, or any other processor combined with memory caches, memory controllers, local storage, I/O bus hubs, etc.

Each processor system 102 further includes an input/output (I/O) adapter 108 that is coupled directly (i.e., without any intervening device) or indirectly (i.e., through at least one intermediate device) to a data storage system 120 via an I/O channel 110. In some embodiments, data storage system 120 may be integral to a processor system 102. In various embodiments, I/O channel 110 may employ any one or a combination of known or future developed communication protocols, including, for example, Fibre Channel (FC), FC over Ethernet (FCoE), Internet Small Computer System Interface (iSCSI), InfiniBand, Transport Control Protocol/Internet Protocol (TCP/IP), Peripheral Component Interconnect Express (PCIe), etc. I/O operations (IOPs) communicated via I/O channel 110 include read IOPs by which a processor system 102 requests data from data storage system 120 and write IOPs by which a processor system 102 requests storage of data in data storage system 120.

Although not required, in the illustrated embodiment, data storage system 120 includes multiple interface cards 122 through which data storage system 120 receives and responds to input/output operations (IOP) of hosts via I/O channels 110. Each interface card 122 is coupled to each of multiple Redundant Array of Inexpensive Disks (RAID) controllers 124 in order to facilitate fault tolerance and load balancing. Each of RAID controllers 124 is in turn coupled (e.g., by a PCIe bus) to non-volatile storage media, which in the illustrated example include multiple flash cards 126 bearing NAND flash memory. In other embodiments, alternative and/or additional non-volatile storage devices can be employed.

In the depicted embodiment, the operation of data storage system 120 is managed by redundant system management controllers (SMCs) 123, which are coupled to interface cards 122 and RAID controllers 124. In various embodiments, system management controller 123 can be implemented utilizing hardware or hardware executing firmware and/or software.

Figure 1B:
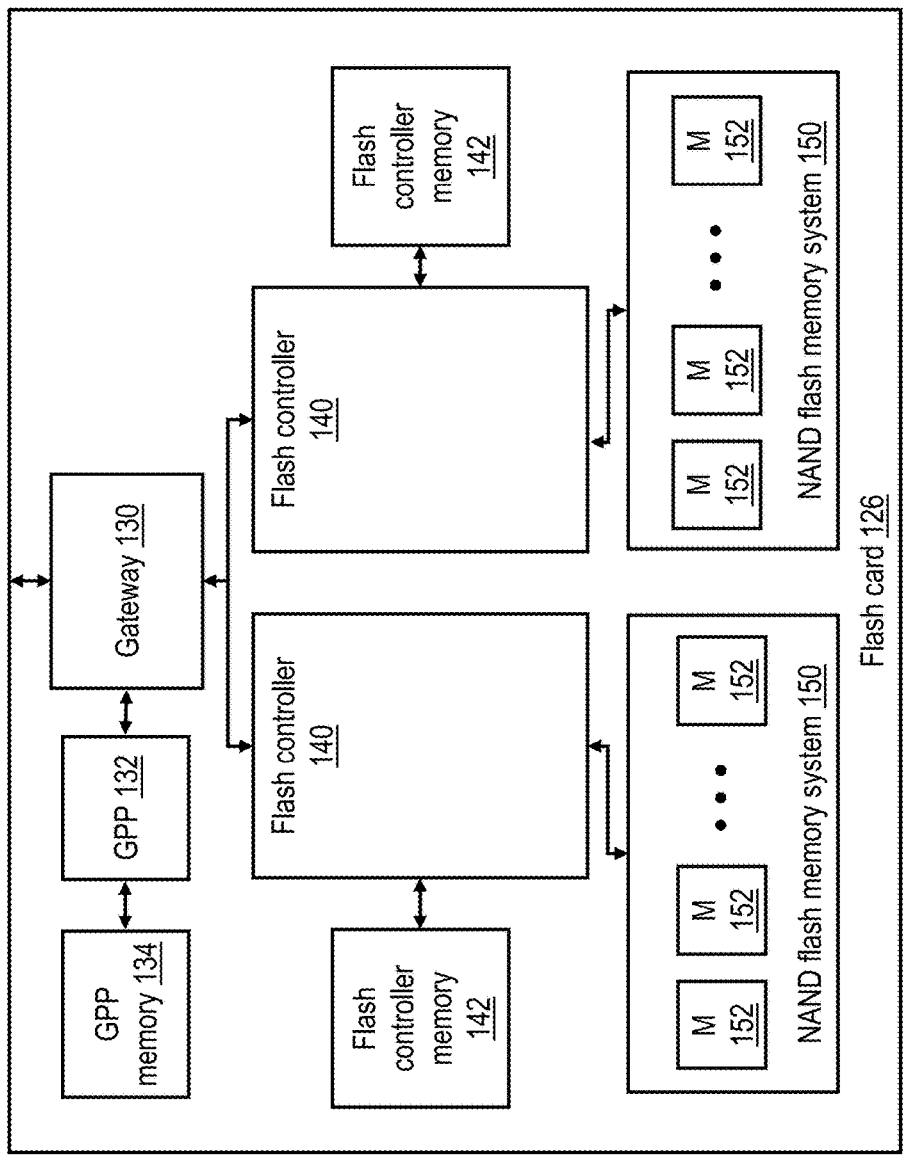
FIG. 1B is a more detailed block diagram of a flash card of the data storage system of FIG. 1A.

FIG. 1B depicts a more detailed block diagram of an exemplary embodiment of a flash card 126 of data storage system 120 of FIG. 1A. Flash card 126 includes a gateway 130 that serves as an interface between flash card 126 and RAID controllers 124. Gateway 130 is coupled to a general-purpose processor (GPP) 132, which can be configured (e.g., by program code) to perform pre-processing on IOPs received by gateway 130 and/or to schedule servicing of the IOPs by flash card 126. GPP 132 is coupled to a GPP memory 134 (e.g., Dynamic Random Access Memory (DRAM)) that can conveniently buffer data created, referenced and/or modified by GPP 132 in the course of its processing or data flowing through the gateway 130 destined for one or more of the flash controllers 140.

Gateway 130 is further coupled to multiple flash controllers 140, each of which controls a respective NAND flash memory system 150. Flash controllers 140 can be implemented, for example, by an Application Specific Integrated Circuit (ASIC) and/or a Field Programmable Gate Array (FPGA) and/or a microprocessor, and each have an associated flash controller memory 142 (e.g., DRAM). In embodiments in which flash controllers 140 are implemented with an FPGA, GPP 132 may program and configure flash controllers 140 during start-up of data storage system 120. After startup, in general operation flash controllers 140 receive read and write IOPs from gateway 130 that request to read data stored in NAND flash memory system 150 and/or to store data in NAND flash memory system 150. Flash controllers 140 service these IOPs, for example, by accessing NAND flash memory system 150 to read or write the requested data from or into NAND flash memory system 150 or by accessing a memory cache (not illustrated) associated with NAND flash memory system 150.

Flash controllers 140 implement a flash translation layer (FTL) that provides logical-to-physical address translation to enable access to specific memory locations within NAND flash memory systems 150. In general, an IOP received by flash controller 140 from a host device, such as a processor system 102, contains the logical block address (LBA) at which the data is to be accessed (read or written) and, if a write IOP, the write data to be stored to data storage system 120. The IOP may also specify the amount (or size) of the data to be accessed. Other information may also be communicated depending on the protocol and features supported by data storage system 120. The flash translation layer translates LBAs received from a RAID controller 124 into physical addresses assigned to corresponding physical location in NAND flash memory systems 150. Flash controllers 140 may perform address translation and/or store mappings between logical and physical addresses in a logical-to-physical translation data structure, such as a logical-to-physical translation table (LPT), which may conveniently be stored in flash controller memory 142.

NAND flash memory systems 150 may take many forms in various embodiments. In the embodiment shown in FIG. 1B, each NAND flash memory system 150 includes multiple (e.g., 32) individually addressable NAND flash memory storage devices 152. In the illustrated example, the flash memory storage devices 152 take the form of a board-mounted flash memory modules, for example, Multi-Level Cell (MLC), Three Level Cell (TLC), or Quad Level Cell (QLC) NAND flash memory modules. The effective storage capacity provided by flash memory storage devices 152 can be increased through the implementation of data compression, for example, by flash controllers 140 and/or high level controllers, such as GPPs 132, RAID controllers 124 or SMCs 123.

Figure 2:
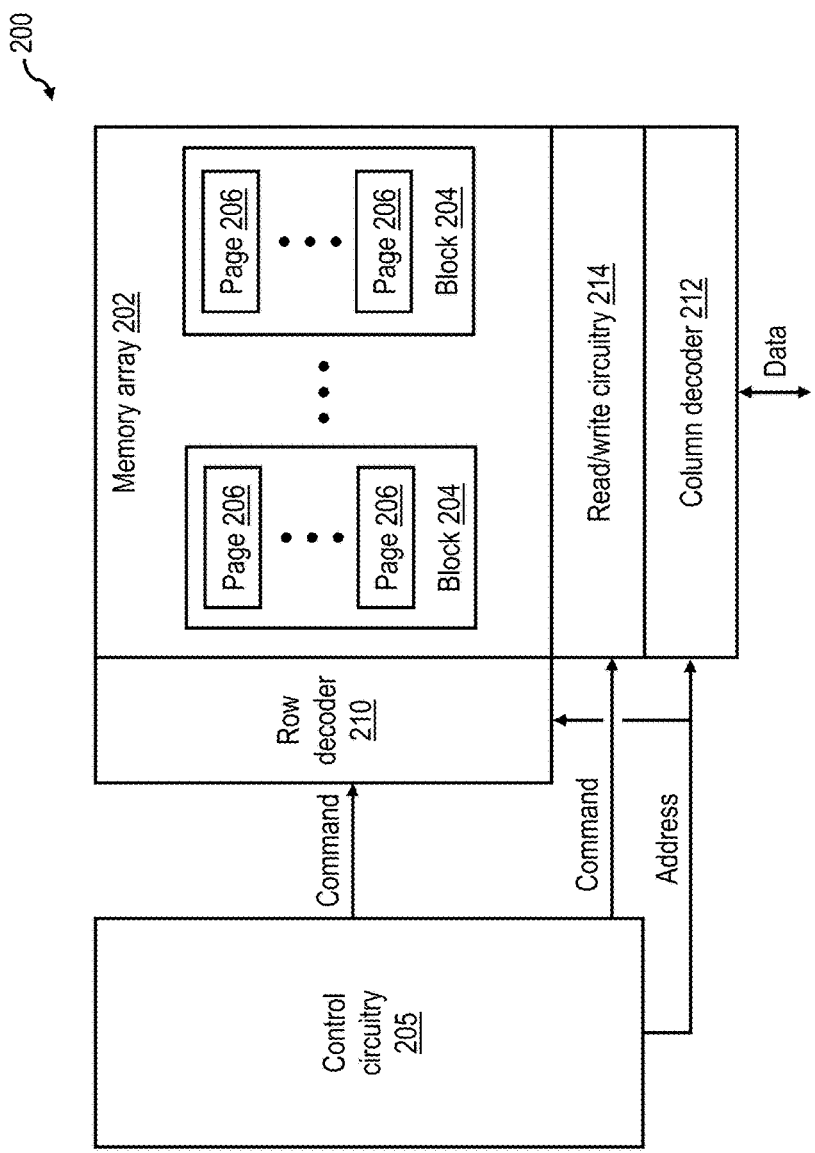
FIG. 2 depicts an exemplary NAND flash memory module in accordance with one embodiment.

Referring now to FIG. 2, there is depicted a block diagram of an exemplary flash memory module 200 that can be utilized to implement any of the NAND flash memory storage devices 152 of FIG. 1B. Flash memory module 200 includes one or more memory die, each implementing at least one memory array 202 formed of a two- or three-dimensional array of NAND flash memory cells. As indicated in FIG. 2, the memory cells within memory array 202 are physically arranged in multiple blocks 204, each in turn including multiple physical pages 206.

As is known to those skilled in the art, NAND flash memory, such as that employed in memory array 202, must be erased prior to being programmed. Further, NAND flash memory can be (but is not required to be) constrained by its construction such that the smallest granule of storage that can be erased is a block 204 and the smallest granule of storage that can be accessed by a read or write IOP is fixed at the size of a single physical page 206. It should be appreciated in this regard that the LBAs provided by host devices correspond to logical pages within a logical address space, where each logical page typically has a size of 4 kilobytes (kB). Physical pages 206, in contrast, typically have a larger size, for example, 16 kB, and can thus correspond to multiple logical pages.

Flash memory module 200 further includes a row decoder 210 through which word lines of memory array 202 can be addressed and a column decoder 212 through which bit lines of memory array 202 can be addressed. In addition, flash memory module 200 includes read/write circuitry 214 that enables the memory cells of a physical page 206 to be programmed or read in parallel. Flash controller 200 additionally includes control circuitry 205 that provides chip-level control of operation of memory array 202, including read and write accesses made to physical pages 206 in memory array 202, erasure of blocks 204, and the amplitude, duration and polarity of related voltages applied to memory array 202.

Having described the general physical structure of one exemplary embodiment of a data storage system 120, certain operational aspects of data storage system 120 are now described with reference to FIG. 3, which is a high level flow diagram of the flash management functions and data structures employed by a GPP 132 and/or flash controller 140 in accordance with one embodiment.

Data storage system 120 does not generally allow external devices (e.g., hosts) to directly address and/or access the physical memory locations within NAND flash memory systems 150. Instead, data storage system 120 is generally configured to present to host devices one or more logical volumes each having a contiguous logical address space, thus allowing host devices to read and write data to and from logical block addresses (LBAs) within the logical address space while permitting one or more of the various levels of controllers (e.g., system management controller 123, RAID controllers 124, flash controllers 140 and GPP 132) to control where the data that is associated with the various LBAs actually resides in the physical memory locations comprising NAND flash memory systems 150. In this manner, performance and longevity of NAND flash memory systems 150 can be intelligently managed and optimized. In the illustrated embodiment, each flash controller 140 performs logical-to-physical address translation for an associated set of LBAs using a logical-to-physical address translation data structure, such as logical-to-physical translation (LPT) table 300, which can be stored, for example, in the associated flash controller memory 142. It should be noted that the logical address supplied to flash controller(s) 140 may be different from the logical address originally supplied to data storage system 120, since various components within data storage system 120 may perform address translation operations between the external devices and the flash controller(s) 140.

Flash management code running on the GPP 132 tracks erased blocks of NAND flash memory system 150 that are ready to be used in ready-to-use (RTU) queues 306, which may be stored, for example, in GPP memory 134. In the depicted embodiment, flash management code running on the GPP 132 maintains one RTU queue 306 per channel (i.e., per data bus), and an identifier of each erased block that is to be reused is enqueued in the RTU queue 306 corresponding to its channel. A build block stripes function 320 performed by flash management code running on the GPP 132 constructs new block stripes for storing data and associated parity information from the erased blocks enqueued in RTU queues 306. The new block stripes are then queued to the flash controller 140 for data placement. Block stripes are preferably formed of blocks residing in different channels, meaning that build block stripes function 320 can conveniently construct a block stripe by drawing each block of the new block stripe from a different RTU queue 306. In general, build block stripes function 320 attempts to construct stripes from blocks of approximately equal health (i.e., expected remaining useful life).

In response to write IOP received from a host, such as a processor system 102, a data placement function 310 of flash controller 140 determines by reference to LPT table 300 whether the target LBA(s) indicated in the write request is/are currently mapped to physical memory page(s) in NAND flash memory system 150 and, if so, changes the status of each data page currently associated with a target LBA to indicate that the associated data is no longer valid. In addition, data placement function 310 allocates a page stripe if necessary to store the write data of the write IOP and any non-updated data (i.e., for write requests smaller than a logical page, the remaining valid data from a previous write to the same logical address which is not being overwritten and which must be handled in a read-modify-write manner) from an existing page stripe, if any, targeted by the write IOP, and/or stores the write data of the write IOP and any non-updated (i.e., still valid) data from an existing page stripe, if any, targeted by the write IOP to an already allocated page stripe which has free space left. The page stripe may be allocated from either a block stripe already allocated to hold data or from a new block stripe built by build block stripes function 320. In a preferred embodiment, the page stripe allocation can be based on the health of the blocks available for allocation and the "heat" (i.e., estimated or measured write access frequency) of the LBA of the write data. Data placement function 310 then writes the write data, associated metadata (e.g., cyclic redundancy code (CRC) and error correcting code (ECC) values), and parity information for the page stripe in the allocated page stripe. Flash controller 140 also updates LPT table 300 to associate the physical page(s) utilized to store the write data with the LBA(s) indicated by the host device. Thereafter, flash controller 140 can access the data to service host read IOPs by reference to LPT table 300 as further illustrated in FIG. 3.

Once all pages in a block stripe have been written, flash controller 140 places the block stripe into one of occupied block queues 302, which flash management code running on the GPP 132 utilizes to facilitate garbage collection. As noted above, through the write process, pages are invalidated, and therefore portions of the NAND flash memory system 150 become unused. The associated flash controller 140 (and/or GPP 132) eventually needs to reclaim this space through garbage collection performed by a garbage collector 312. Garbage collector 312 selects particular block stripes for garbage collection based on a number of factors including, for example, the health of the blocks 204 within the block stripes and how much of the data within the erase blocks 204 is invalid. In the illustrated example, garbage collection is performed on entire block stripes, and flash management code running on GPP 132 logs the block stripes ready to be recycled in a relocation queue 304, which can conveniently be implemented in the associated flash controller memory 142 or GPP memory 134.

The flash management functions performed by GPP 132 or flash controller 140 additionally include a relocation function 314 that relocates the data held in block stripes enqueued in relocation queue 304. To relocate such data, relocation function 314 updates LPT table 300 to remove the current association between the logical and physical addresses of the data. In addition, relocation function 314 issues relocation write requests to data placement function 310 to request that the valid data of the old block stripe be written to a new block stripe in NAND flash memory system 150. Once all remaining valid data has been moved from the old block stripe, the old block stripe is passed to dissolve block stripes function 316, which decomposes the old block stripe into its constituent blocks 204, thus disassociating the blocks 204. Each of the blocks 204 formerly forming the dissolved block stripe is then erased under the direction of flash controller 140 and/or the control circuitry 205 of the relevant flash memory module 200, and a corresponding program/erase (P/E) cycle count 334 for each erased block is incremented. Based on the health metrics of each erased block 204 (e.g., bit error rate (BER) metrics, uncorrectable errors, P/E cycle count, etc.), each erased block 204 is either retired (i.e., withdrawn from use) by a block retirement function 318 among the flash management functions executed on GPP 132, or alternatively, prepared for reuse by placing the block 204 on the appropriate ready-to-use (RTU) queue 306 in the associated GPP memory 134.

Figure 3:
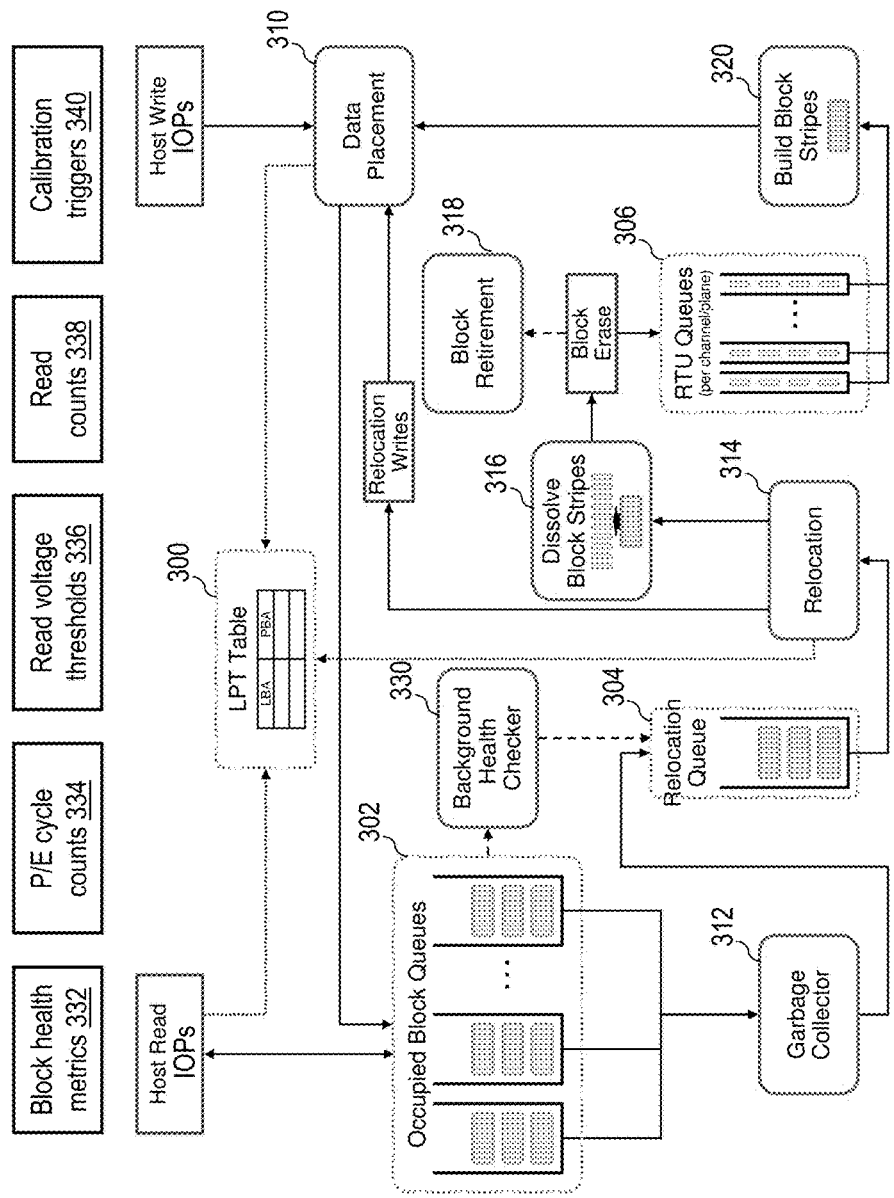
FIG. 3 is a high level flow diagram of the flash management functions and data structures employed in flash management in accordance with one embodiment.

As further shown in FIG. 3, the flash management functions executed on GPP 132 and/or flash controller 140 additionally include a background health checker 330. Background health checker 330, which operates independently of the read and write IOPs of hosts such as processor systems 102, continuously determines one or more block health metrics 332 for blocks belonging to block stripes recorded in occupied block queues 302. Based on the one or more of the block health metrics 332, background health checker 330 places block stripes on relocation queue 304 for handling by relocation function 314. Key block health metrics 332 preferably monitored and recorded by background health checker relate to the bit error rate (BER) metrics observed for valid blocks and physical pages, and may include, for example, the worst page BER of each block, the mean page BER of each block, the rates of change of the worst page BER and mean page BER of each block, etc. In order to obtain the most accurate health estimate possible, health can be determined from an analysis of valid and invalid data, thereby ensuring that blocks containing almost entirely invalid data are fully analyzed to determine overall block health.

As described in greater detail below, one function of GPP 132 and/or flash controller 140 that can be incorporated within background health checker 330 or that can be separately implemented is the periodic adaptation of read voltage thresholds 336 utilized to decode the data bits stored within the memory cells of memory arrays 202. These read voltage thresholds 336, which can be individually defined to any desired level of granularity (e.g., per-page, per page group within a block, per block, etc.), are preferably selected to improve one or more bit error metrics. As further depicted in FIG. 3, GPP 132 and/or flash controller 140 preferably track additional statistics to facilitate intelligent adaptation of read voltage thresholds 336. These additional statistics can include read counts 338 indicating a number of times a given memory unit (e.g., page, page group and/or block) has been read since being programmed. In addition, these statistics can include calibration triggers 340, such as per-memory unit counters indicating an elapsed amount of time since read voltage thresholds of that memory unit were adapted and/or per-block counters indicating a number of program/erase cycles that each block has been subjected to since the read voltage thresholds for that block were last adapted.

Referring now to FIGS. 4A-4B, there is depicted initial and subsequent programmed threshold voltage distributions ($V_{TH}$) for an exemplary multi-level cell (MLC) NAND flash memory. As shown in FIG. 4A, when a block 204 of a NAND flash memory storage device 152 is first put into service, each of the four voltage distributions 400a, 400b, 400c and 400d, respectively representing bit values 11, 10, 00 and 01, is tight and well defined. Consequently, the bit values of the various memory cells can be decoded with little or no error by application of initial read voltage thresholds VA 402a, VB 402b and VC 402c.

Through use, the memory cells within block 204 will be damaged by, among other things, the voltage stress associated with program/erase (P/E) cycling. As a result of this damage, the distribution of memory cell voltages will no longer reflect the tight distributions shown in FIG. 4A, but will instead be characterized by broader and/or shifted voltage distributions 406a, 406b, 406c, 406d shown in FIG. 4B. Because of the degradation of the voltage distributions, bit values can be erroneously decoded if read voltage thresholds VA 402a, VB 402b and VC 402c continue to be applied, and the bit error rate (BER) for reads to the block will consequently increase.

To reduce the BER for the block, GPP 132 and/or flash controller 140 periodically adapts the read voltage thresholds for one or more individual memory units (e.g., a page, page groups and/or a block) either negatively (not illustrated) or positively (as shown explicitly in FIG. 4B). For example, in FIG. 4B read voltage thresholds VA 402a, VB 402b and VC 402c are each shifted positively by an individually determined offset ΔA, ΔB or ΔC selected to reduce and/or minimize the BER. Thus, in the example of FIG. 4B, read voltage thresholds VA 402a, VB 402b and VC 402c are replaced by read voltage thresholds VA+ΔA 404a, VB+ΔB 404b and VC+ΔC 404c, respectively. As described below, the signs and magnitudes of the read voltage threshold offsets selected by GPP 132 and/or flash controller 140 can and will vary over the lifetime of the block based on at least the operating state of the memory unit in question.

With reference now to FIGS. 5A-5B, there is illustrated a set of graphs of exemplary bit error rate curves for blocks of an exemplary multi-level NAND flash memory under test. In FIGS. 5A-5B, the X axis represents advancing time that in general reflects P/E cycles or read cycles or actual retention time depending on the operating state of the block under test, and the bit error rate (BER) of the blocks under test are graphed along the Y axis. The BER curves generally reflect the degradation of the programmed threshold voltage distributions of the block over time due to P/E cycling, read disturb effects, and data retention.

As shown in FIG. 5A, during the period 500 defined by times T0 and T1, curve 516, which represents the bit error rate of a first block under test, climbs slowly, reflecting the errors induced by the memory cell damage caused by accumulated P/E cycles. In this exemplary scenario, period 500 represents a P/E cycling operating state with large number of fast P/E cycles. After operating in this P/E cycling operating state during period 500, at time T1 the block transitions to an early data retention operating state in which the data in the block is retained unmodified. As indicated by the slope of curve 516 during the period 502 defined by times T1 and T2, in the early data retention state that follows a large number of accumulated P/E cycles the bit error rate of the block increases abruptly. The rate of increase of the bit error rate (indicated by the slope of curve 516) moderates somewhat in the mid data retention state in period 504 defined by times T2 and T3. In the late data retention state following time T3 (i.e., in period 506), the rate of increase in the bit error rate of the first block drops further. After the operating state 506, the first block under test enters another P/E cycling period 508 defined by times T4 and T5. The bit error rate at time T4 drops to approximately the error level at the end of the previous P/E cycling state, i.e., at the end of period 500 at time T1, and increases gradually until time T5. In this exemplary scenario, period 508 represents a P/E cycling operating state with small number of slow P/E cycles. Following state 508 starts another early data retention operating state during period 510 defined by times T5 and T6. As indicated by the slope of curve 516 during the period 510 the bit error rate increases moderately compared to early data retention period 502. This is attributed to the differences between the previous P/E cycling operating states, i.e., the large number of fast accumulated P/E cycles in period 500 and the small number of slow P/E cycles in period 508. Following time T6 the block enters a mid-data retention period 512, and later at time T7 enters a late data retention period 514 where the bit error continuous to increase but the error level as indicated by the curve 516 is lower compared to late data retention period 506. The exemplary scenario in FIG. 5A shows that block under test may enter different operating states where the level and slope of the bit error rate curve 516 change depending on the current and previous operating states.

In contrast to curve 516, which illustrates the effects of P/E cycling and data retention, curve 526 in FIG. 5B illustrates the impact of P/E cycling and read disturb effects on the bit error rate of a second block under test. During the period 518 between times T0 and T1, the second block under test is also in a P/E cycling operating state. After operating in this P/E cycling operating state during period 518, at time T1 the second block associated with curve 526 transitions to an early read disturb operating state in which the data in the second block is repetitively read, but is not modified. As indicated by the slope of curve 526 following time T1, the bit error rate of the second block also increases abruptly. At time T2, the second block enters a mid-read disturb operating state, defined by period 522, in which the rate of increase of the bit error rate (indicated by the slope of curve 526) moderates, despite the fact that reads that induce read disturb effects are ongoing. Following time T3, the block enters a late read disturb operating state, defined by period 524, in which the bit error rate increases more slowly.

In the examples given in FIGS. 5A-5B, a given memory unit can be in any one of eight different operating states, namely, the P/E cycling operating state of many and fast P/E cycles, or few and slow P/E cycles, the early, mid and late read disturb operating states, or the early, mid-, and late data retention operating states. It should be appreciated that in other embodiments, the controller may define a greater or fewer number of operating states for each memory unit.

As noted above, conventional techniques of adapting the read voltage thresholds of a memory unit do not do not account for differences in the amount and rate of degradation of the distributions of threshold voltages based on the different possible operating states of the memory unit under test (e.g., program/erase (P/E) cycling, data retention, or read disturb) as depicted in FIGS. 5A-5B. In addition, conventional techniques of adapting the read voltage thresholds of a memory device are not able to adapt sufficiently quickly to compensate for the abrupt changes in the threshold voltage distributions as shown, for example, in FIG. 5A following time T1. These shortcomings in the prior art are overcome by the exemplary techniques of adapting read voltage thresholds described below with reference to FIGS. 6-7.

Figure 6:
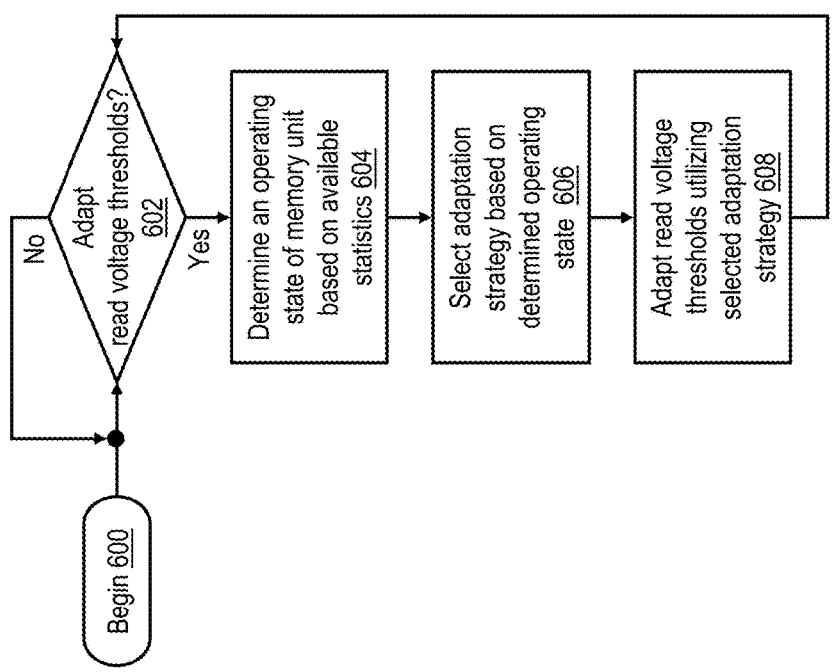
FIG. 6 is a high level logical flowchart of an exemplary process for adapting read voltage thresholds of a non-volatile memory in accordance with one embodiment.

Referring now to FIG. 6, there is depicted a high level logical flowchart of an exemplary process for adapting read voltage thresholds of a non-volatile memory in accordance with one embodiment. The exemplary process, which is preferably performed by a controller, such as a GPP 132 and/or flash controller 140, can be incorporated within background health checker 330 or can be separately implemented. In various embodiments, the read voltage thresholds can be individually defined for a memory unit at any desired level of granularity (e.g., per-page, per page group within a block, per block, etc.).

The process of FIG. 6 begins at block 600 and then proceeds to block 602, which illustrates the controller determining whether or not to adapt read voltage thresholds for a memory unit (or a collection of memory units) in a non-volatile memory, such as one of NAND flash memory storage devices 152. For example, in some embodiments, the controller determines whether or not to adapt the read voltage thresholds of a memory unit by reference to one or more calibration triggers 340, such as per-memory unit counters indicating an elapsed amount of time since read voltage thresholds of that memory unit were most recently adapted and/or per-block counters indicating a number of P/E cycles that each block has been subjected to since the read voltage thresholds for that block were last adapted. In response to a determination at block 602 to not adapt the read voltage thresholds, the process iterates at block 602. In response to the controller determining at block 602 to adapt the read voltage thresholds of the memory unit, the process proceeds from block 602 to block 604.

Block 604 depicts the controller determining an operating state of the memory unit based on the available statistics. For example, the controller can make the determination based on one or more statistics, such as the number of P/E cycles that the memory unit has been subjected to since the read voltage thresholds for that memory unit were last adapted (as indicated by calibration triggers 340), the time interval that has elapsed since the memory unit was last programmed, the bit error rate(s) of the memory unit (as reported by block health metrics 332), and/or the number of times the memory unit has been read since last programmed (as indicated by read counts 338). In one exemplary embodiment, the controller determines that the memory unit is in a P/E cycling operating state if the number of P/E cycles to which the memory unit has been subjected since the read threshold voltages were last adapted satisfies (e.g., is greater than or equal to) a predetermined P/E cycle count threshold. In this example, if the controller determines that the memory unit is not in the P/E cycling operating state, the controller determines which of the various read disturb operating states or data retention operating states the memory unit is in based on one or more criteria, such as the time elapsed since the memory unit was last programmed and the read count of the memory unit (or the block containing the memory unit) since the memory unit was last programmed. For example, the controller may determine that the memory unit is in one of the read disturb operating states if the read count satisfies (e.g., is greater than or equal to) a read count threshold and then determine which of the read disturb operating states the memory unit is in based on the time elapsed since the memory unit was last programmed and/or read counts 338). Alternatively, the controller may determine that the memory unit is in one of the data retention operating states if the memory unit does not satisfy the read count threshold and choose one of the data retention operating states based on the time elapsed since the memory unit was last programmed.

The process proceeds from block 604 to block 606, which depicts the controller selecting an adaptation strategy based on the determined operating state of the memory unit. For example, in at least some embodiments, the adaptation strategy specifies both a number of candidate read voltage threshold offsets to be tested in the current iteration of the adaptation process and a range of candidate read voltage threshold offsets. For example, in one embodiment, in response to determining at block 604 that the operating state of the memory unit is the P/E cycling operating state, which as noted in FIGS. 5A-5B is generally characterized by gradual changes to the read voltage distributions and bit error rate, the controller selects an adaptation strategy in which a small number of read voltage threshold offsets in a narrow range are tested. As one possible implementation, three read voltage threshold offsets for each read voltage threshold may be tested, including the current read voltage threshold (i.e., an offset of 0) and small positive and negative offsets from each of the current read voltage thresholds (e.g., ±Δ). Thus, this adaptation strategy may be characterized by the offset set of {0, ±Δ}. In some embodiments, the specific amount of the offset (Δ) as well as the numbers and ranges of offsets to be tested can be predetermined by the controller based on characterization data for the memory under test.

In response to determining at block 604 that the operating state of the memory unit is the early read disturb operating state, which as noted in FIGS. 5A-5B is characterized by abrupt changes in the read voltage distributions and bit error rate, the controller preferably selects both a relatively large set of read voltage threshold offsets to test and a large range of such offsets. For example, in one embodiment, this adaptation strategy may be characterized by the offset set of {0, ±Δ, ±2Δ, ±3Δ}. If the controller instead determines at block 604 that the memory unit is in the late read disturb operating state, the adaptation strategy selected by the controller at block 606 may instead be characterized by a smaller number and/or range of offsets, such as the offset set {0, ±Δ, ±2Δ}.

In response to determining at block 604 that the operating state of the memory unit is the early data retention operating state, which as noted in FIGS. 5A-5B is characterized by abrupt changes to the read voltage distributions and bit error rate, the controller preferably selects both a relatively large set of read voltage threshold offsets to test and a large range of such offsets. For example, in one embodiment, this adaptation strategy may be characterized by the offset set of {-Δ, -2Δ, -3Δ}. As indicated by this example, in some memories, characterization may show that in a given operating state the shifts in the read voltage distributions are uniformly in one direction and thus the offset set to be tested may advantageously be smaller than if both positive and negative offsets were tested. If the controller instead determines that the memory unit is in the mid-data retention operating state or late data retention operating state, the adaptation strategy selected by the controller at block 606 may instead be characterized by the offset sets {0, -Δ, -2Δ} and {0, ±Δ}, respectively.

Following the selection of the adaptation strategy at block 606, the controller adapts the read voltage thresholds of the memory unit utilizing the selected adaptation strategy. For example, in at least some embodiments, the controller reads some or all of the data from the memory unit utilizing each of the read voltage thresholds determined from the current set of read voltage thresholds 336 and the offsets in the offset set of the selected adaptation strategy. The controller chooses for inclusion in an updated set of read voltage thresholds the ones that provide a lowest bit error rate according to a selected metric (e.g., worst page BER or average page BER). At block 608, the updated set of read voltage thresholds for the memory unit is then recorded in read voltage thresholds 336. Following block 608, the process of FIG. 6 returns to block 602, which has been described.

In the embodiment described above with reference to FIG. 6, the range and number of candidate offset values in an offset set is static and can be determined, for example, based on characterization data for the memory. In alternative embodiments such as that disclosed in FIG. 7, the range and/or number of candidate offset values represented in an offset set can instead be determined by the controller dynamically based on bit error rate (BER) feedback.

Figure 7:
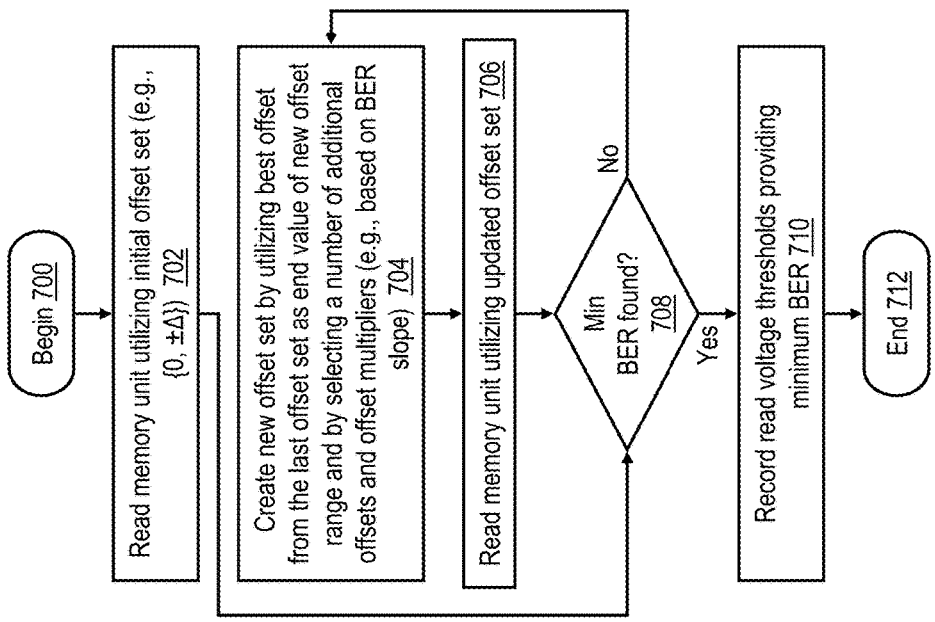
FIG. 7 is a high level logical flowchart of an exemplary process for dynamically determining the range and/or number of candidate offset values to be used to adapt read voltage thresholds based on bit error rate feedback.

With reference now to FIG. 7, there is illustrated a high level logical flowchart of an exemplary process for dynamically determining the range and/or number of candidate offset values to be used to adapt read threshold voltages based on bit error rate feedback. The illustrated process can be utilized to implement blocks 606-608 of FIG. 6. For ease of understanding, the process of FIG. 7 is described below with additional reference to FIGS. 8A-8C, which are graphs illustrating the BERs associated with various read voltage threshold offsets.

The process of FIG. 7 begins at block 700 and then proceeds to block 702, which illustrates the controller reading the memory unit utilizing an initial offset set that preferably includes the current read voltage threshold. FIG. 8A illustrates one such initial offset set {0, ±Δ}, which specifies testing of the BER of the memory unit at the current read voltage threshold (V0) and the two adjacent read voltage thresholds V0−Δ and V0+Δ. Following block 702, the process of FIG. 7 proceeds to block 708, which illustrates the controller determining whether or not the read voltage threshold offset resulting in the minimum BER for the memory unit was found utilizing the initial offset set. For example, the controller can determine that the minimum BER has been found if reading the memory unit utilizing the offsets −Δ and +Δ results in greater BERs than utilizing an offset of 0. In response to a determination at block 708 that the offset providing the minimum BER has been successfully identified, the process proceeds from block 708 to block 710, which is described below. However, in response to a determination at block 708 that reading data from the memory unit utilizing the current offset set did not definitively identify the offset providing the minimum BER for the memory unit (as would be the case in the example given in FIG. 8A), the process proceeds to block 704.

Block 704 illustrates the controller creating a new offset set to test by utilizing the offset in the previous offset set that provided the lowest BER as the end value of new offset range and by selecting a number of additional offsets and/or offset multipliers. In some embodiments, the range and/or number of offsets selected for inclusion in the new offset set at block 704 can be determined based on the BER slope observed for the different values in the previous offset set. For example, in some embodiments, at block 704 the controller retains a same number of offsets (e.g., 3) in the offset set, but varies a multiplier by which the base offset (Δ) is multiplied based on the BER slope. In other embodiments, both the number of offsets in the new set of offsets and the offset multiplier are varied. In general, the controller may utilize more offsets and/or use larger offset multiplier(s) if the BER slope is relatively large and utilize fewer offsets and/or smaller offset multiplier(s) if the BER slope is relatively small. As one example, assuming that testing utilizing the initial offset set revealed that the offset of −Δ provided the lowest BER, at block 704 the controller may create a new offset set {−Δ, −2Δ, −3Δ}, as shown in FIG. 8B.

At block 706, the controller reads data from the memory unit utilizing the read voltage threshold offsets in the updated offset set and notes the BER obtained through the use of each offset. The controller then determines at block 708 whether or not the offset resulting in the minimum BER for the memory unit was found utilizing the updated offset set. If not, the process returns to block 704 and following blocks, which have been described. In so doing, the controller incrementally approaches the optimal or near optimal offset that results in the minimum BER for the memory unit. If the controller instead determines at block 708 that it has found the offset that results in the minimum BER for the memory unit as shown in FIG. 8C, the controller records the read voltage thresholds providing the minimum BER for the memory unit in read voltage thresholds 336. Thereafter, the process of FIG. 7 ends at block 712.

Although the process of FIG. 7 is a dynamic iterative process, it has been experimentally found for sample memories that the process can identify the new read voltage thresholds to be used to read the memory in only a few iterations, e.g., in less than four iterations on average.

In some embodiments, it may be useful and desirable to track the read voltage threshold 336 for each block using a combination of multiple parameters. For example, in one embodiment, read voltage thresholds 336 may be specified by applying an offset to the default read voltage threshold, where the offset comprises a "base" component ($V_{base}$) that tracks a permanent deviation from the default read voltage threshold (e.g., due to P/E cycling) and a "temporary" component ($V_{temp}$) that tracks temporary changes of read voltage thresholds (e.g., due to data retention or read disturb effects). In such an embodiment, the "base" component is adjusted during a P/E cycling operating state and retains its value during a data retention or read disturb operating state, while the "temporary" component is adjusted during a data retention or read disturb operating state and is zeroed during a P/E cycling operating state. Furthermore, in such an embodiment, the current read voltage threshold (V0) employed in block 702 can be determined by adding the "base" and "temporary" components to the default read voltage threshold, where in particular, the value of the "base" component reflects the read voltage threshold for the current or most recent P/E cycling operating state while the value of the "temporary" component is zero if the operating state is one of the P/E cycling operating states. The final read voltage threshold can be determined by adding the new "delta" component determined by the iterative process of FIG. 7. More specifically, the new "delta" component selected in block 708 to give the minimum BER is used to update either the "base" component if the operating state is one of the P/E cycling operating states or the "temporary" component if the operating state is one of the data retention or read disturb operating states. One advantage of such an approach is that, depending on the characteristics of each operating state, e.g., permanent degradation of $V_{TH}$ in a P/E cycling operating state or temporary degradation of $V_{TH}$ in a data retention or read disturb operating state, the appropriate component of the read voltage threshold, namely the "base" or the "temporary" component, is updated accordingly. Furthermore, after an operating state change is detected, for example, at time T4 of FIG. 5A, the "base" component can be retained, while the "temporary" component can be discarded.

As has been described, in at least one embodiment, a controller adapts the read voltage thresholds of a memory unit in a non-volatile memory by determining, based on statistics for a memory unit of the non-volatile memory, an operating state of the memory unit from among a plurality of possible operating states. The controller then adapts at least one read voltage threshold for a memory cell in the memory unit based on the determined operating state.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the present invention has been particularly shown as described with reference to one or more preferred embodiments, it will be understood by those skilled in the art that various changes in form and detail may be made therein without departing from the spirit and scope of the invention. For example, although aspects have been described with respect to a data storage system including a flash controller that directs certain functions, it should be understood that present invention may alternatively be implemented as a program product including a storage device storing program code that can be processed by a processor to perform such functions or cause such functions to be performed. As employed herein, a "storage device" is specifically defined to include only statutory articles of manufacture and to exclude signal media per se, transitory propagating signals per se, and energy per se.

In addition, although embodiments have been described that include use of a NAND flash memory, it should be appreciated that embodiments of the present invention can also be used with any other type of non-volatile random access memory (NVRAM).

The figures described above and the written description of specific structures and functions below are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding. Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. A method of adapting read voltage thresholds in a non-volatile memory, the method comprising:
   a controller determining, for a memory unit of the non-volatile memory, an operating state of the memory unit from among a plurality of possible operating states, wherein the plurality of operating states includes at least first and second operating states; and
   the controller adapting at least one read voltage threshold for a memory cell in the memory unit based on the determined operating state, wherein the adapting includes updating the at least one read voltage threshold utilizing a large negative voltage offset in response to detecting a transition of the memory unit from the first operating state to the second operating state.

2. The method of claim 1, wherein the adapting includes the controller selecting at least a number of candidate read voltage thresholds to test.

3. The method of claim 2, wherein the selecting includes dynamically selecting the number of candidate read voltage thresholds to test based on a bit error rate obtained by reading the memory unit utilizing at least one candidate read voltage threshold.

4. The method of claim 1, wherein the adapting includes the controller selecting a range of candidate read voltage thresholds to test.

5. The method of claim 1, wherein the adapting includes adapting the at least one read voltage threshold based on static memory characterization data.

6. The method of claim 1, wherein the plurality of possible operating states includes a cycling operating state in which the memory unit is subjected to repeated programming and erasure, a read disturb operating state, and a data retention operating state.

7. A data storage system, comprising:
a controller for a non-volatile memory, wherein the controller is configured to determine, for a memory unit of the non-volatile memory, an operating state of the memory unit from among a plurality of possible operating states and to adapt at least one read voltage threshold for a memory cell in the memory unit based on the determined operating state, wherein the controller is configured to update the at least one read voltage threshold utilizing a large negative voltage offset in response to detecting a transition of the memory unit from a first operating state to a second operating state.

8. The data storage system of claim 7, wherein the controller is configured to select at least a number of candidate read voltage thresholds to test based on the determined operating state.

9. The data storage system of claim 8, wherein the controller is further configured to dynamically select the number of candidate read voltage thresholds to test based on a bit error rate obtained by reading the memory unit utilizing at least one candidate read voltage threshold.

10. The data storage system of claim 7, wherein the controller is configured to select a range of candidate read voltage thresholds to test.

11. The data storage system of claim 7, wherein the controller is configured to adapt the at least one read voltage threshold based on static memory characterization data.

12. The data storage system of claim 7, wherein the plurality of possible operating states includes a cycling operating state in which the memory unit is subjected to repeated programming and erasure, a read disturb operating state, and a data retention operating state.

13. A computer program product, the computer program product comprising a computer readable storage medium having program instructions embodied therewith, the program instructions executable by a controller to cause the controller to perform:
determining, for a memory unit of the non-volatile memory, an operating state of the memory unit from among a plurality of possible operating states; and
adapting at least one read voltage threshold for a memory cell in the memory unit based on the determined operating state, wherein the adapting includes updating the at least one read voltage threshold utilizing a large negative voltage offset in response to detecting a transition of the memory unit from a first operating state to a second operating state.

14. The computer program product of claim 13, wherein the adapting includes the controller selecting at least a number of candidate read voltage thresholds to test.

15. The computer program product of claim 14, wherein the selecting includes dynamically selecting the number of candidate read voltage thresholds to test based on a bit error rate obtained by reading the memory unit utilizing at least one candidate read voltage threshold.

16. The computer program product of claim 13, wherein the adapting includes the controller selecting a range of candidate read voltage thresholds to test.

17. The computer program product of claim 13, wherein the adapting includes adapting the at least one read voltage threshold based on static memory characterization data.

18. The computer program product of claim 13, wherein the adapting includes updating the at least one read voltage threshold utilizing a large negative voltage offset in response to detecting a transition of the memory unit from a first operating state to a second operating state.

19. The computer program product of claim 13, wherein the plurality of possible operating states includes a cycling operating state in which the memory unit is subjected to repeated programming and erasure, a read disturb operating state, and a data retention operating state.

* * * * *